United States Patent

Keese

[15] 3,651,469

[45] Mar. 21, 1972

[54] BINARY TOUCH-TUNE SYSTEM WITH MEMORY

[72] Inventor: David F. Keese, Cedar Rapids, Iowa

[73] Assignee: Collins Radio Company, Cedar Rapids, Iowa

[22] Filed: Mar. 22, 1971

[21] Appl. No.: 126,776

[52] U.S. Cl. ..........................................340/168 R, 325/470

[51] Int. Cl.........................................H04b 1/16, H04q 9/00

[58] Field of Search.............340/168, 167; 343/228; 325/25, 325/171, 176, 351, 455, 458, 464, 470

[56] References Cited

UNITED STATES PATENTS 3,582,783 6/1971 Hendrickson..........................340/167

3,602,822 8/1971 Evans et al...........................325/470

*Primary Examiner*—Donald J. Yusko

*Attorney*—Richard W. Anderson and Robert J. Crawford

[57] ABSTRACT

A remote control system employing a binary memory matrix is disclosed. A binary control code word is generated by selective application of clock pulses to a step-controlled code generating means. The memory matrix is employed in conjunction with a control indicator to effect bidirectional incremental control steps of a controlled device. Pre-set word channels of the memory matrix may have written therein readily changeable selected code words for subsequently commanded read-out to control the device to one of a plurality of predetermined controlled conditions.

14 Claims, 4 Drawing Figures

INVENTOR
DAVID F. KEESE
BY R.W. Anderson
AGENT

INVENTOR
DAVID F. KEESE
BY R. W. Anderson
AGENT

INVENTOR
DAVID F. KEESE
BY R.W. Anderson
AGENT

BINARY TOUCH-TUNE SYSTEM WITH MEMORY

This invention relates to electrical remote tuning systems and more particularly to a purely electronic system including an electronic memory for selectively tuning a radio continuously over a predetermined band or to one of a plurality of preselected tuned conditions by means of preset electronically stored data.

In my copending application, Ser. No. 814,779, filed Apr. 7, 1969, now U.S. Pat. No. 3,573,734, an electronic tuning system for a radio is described wherein a reversible binary counter is caused to provide a binary output in response to a touch tuning control system which applies predetermined numbers of periodic pulses from a clock source to either the forward or reverse input terminals of the reversible counter. The system therein described includes a code conversion means receiving the binary output from the counter and supplying a desired code to tune a radio, with the output from the code converter means being applied simultaneously to an indicator to provide a visual indication of the frequency to which the tuned unit is simultaneously tuned. In such systems, it is to be understood that the unit to be tuned includes electronic means responsive to a particular tuning code to cause the radio to tune to a prescribed channel or frequency.

In systems such as in the above referenced copending application the operator, by pressing a tuning control switch, incrementally increases or decreases the frequency of a tuned device at a preselected rate. In a more sophisticated system of this type, a plurality of decades of tuning are accomplished by applying the clock impulses to a plurality of counters which are collectively instrumental in controlling the tuned condition of the tuned unit as to, for example, hundreds, tens and units digits, respectively.

It may ofttimes be desired to tune the electronically tuned device to one of a number of preset frequencies, and the present invention has as a primary object thereof the provision of an electronic system of a type generally described in the above referenced copending application, Ser. No. 814,779, now U.S. Pat. No. 3,573,734, with the unique inclusion of an electronic memory means cooperating with the binary counter tuning code output in a manner to permit continuous tuning over the tuning range of the tuned device or automatic tuning of a selected one of a number of preset "channels."

The present invention is featured in the provision of a plated wire memory device in an electronic tuning system of the touch-tune type by means of which the system has the capability of tuning a radio to any allowed frequency within its band at any time by continuously writing in and reading out of one of the available channels in the memory which might be termed a "manual" channel, or by using the up-down counter outputs directly to determine the "manual" frequency.

The invention is further featured in the provision of "memory" storage channels into which preselected tuning code words may be stored and read out upon operator command to automatically tune the radio to the preset frequency.

A still further feature of the present invention is provision for means permitting a change of the preselected tuning code storage words upon operator command.

These and other features of the present invention will become apparent upon reading the following description with reference to the accompanying drawings in which.

Figure 1:
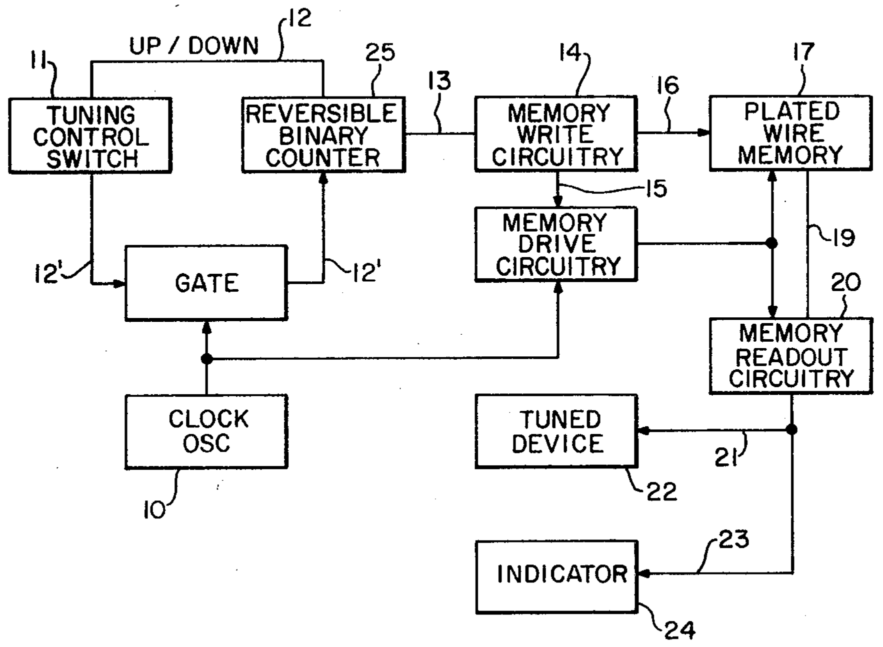
FIG. 1 is a general block diagram of an electronic tuning system with preset memory capability in accordance with the present invention.

Previous "memory" systems as concerns the tuning of radios to preselected channels, have employed mechanical memory drums to provide the function. The memory drum had to be preset, by manually locating switch activating pins in specific slots, to set a specific frequency into a certain channel. The use of such a mechanical memory drum in an "electronic touch-tune" system would entail a motor driven drum located in a remote area of the plane or, alternatively, a drum manually turned by the operator, and requiring a considerable volume in the immediate area of the operator. By contradistinction, the memory system of the present invention provides an electronic touch-tuning system as defined in the above referenced copending application, Ser. No. 814,779, with the capability of presetting memory channels by merely depressing a "write" button on the operator interface unit.

While other memories other than the plated wire type might be employed in the system to be described, the plated wire memory is the most desirable in that it provides a nondestructive readout, operates at lower power levels, has excellent temperature characteristics, and is physically smaller and easier to construct. Thus, the system to be described has advantages over conventional systems in providing a made to order (circuit-wise) memory for electronic touch-tuning systems, permitting extreme ease of changing stored frequency information in any given channel.

The system to be described, by way of example, is a four-bit binary code system permitting continuous tuning over one channel and provided with three additional memory or preset channels in which the stored frequency information may be readily altered by the operator. It is to be understood that the system is readily expandable to multi-decade binary code systems such as systems employing three touch-tune switches respectively controlling the hundreds, tens, and units digits of a controlled device. Expansion of the basic system to more sophisticated systems will be seen to be readily accomplished by incorporation of further code-bit and word channels in the memory matrix.

The term "touch tune system" as used herein refers to electronic tuning systems of the type generally defined in the above referenced copending application. In general these systems tune a code responsive controlled device by controlling the count in a binary counter by selective application of a predetermined number of clock pulses under the control of an operator controlled switch. The count in the binary counter may be altered in either a forward or reverse direction by depressing, for example, a rocker-arm switch to one of two positions corresponding to "tune up" and "tune down" respectively. The output from the counter directly represents a count in binary form, to which binary code responsive electronic tuning means in the control device may be tuned to a preselect frequency. The above mentioned, more sophisticated devices may employ binary coded decimal counters having a number of decades respective providing outputs corresponding to the respective significant digits of a tuned frequency.

As will be further described, the present invention provides manual operation by using a preassigned single channel of a multichannel plated wire memory to continuously have read into, and read out of, the coded outputs from the binary counter for application to a tuned device and to an indicator by means of which the operator may observe the instantaneously tuned condition of the tuned device. It is to be understood that the alternate method of using the tune information directly from the counters to channel the tuned device while in the manual mode of operation can also be employed with this system. In addition to operating in a purely "manual" sense, others of the channels in the plated wire memory may be reserved for storage of preselected different code words for selective application to the tuned device to provide a preset channel capability.

Plated wire memory devices are well known in the art and it would suffice here to describe a plated wire memory matrix in only those general operational principles necessary to an understanding of the present invention. In general the plated wire memory matrix comprises a plurality of parallel plated wire elements around which are formed a plurality of single or multiple loop "word-lines" arranged perpendicular to longitudinal axes of the plated wires. As concerns any one of the "intersections" of a word-line at a given point on one plated wire, a code bit may be written into the wire at the "intersection" in the form of a magnetization of predetermined polarity or sense. The write function is accomplished by applying an information pulse of one sense (polarity) or another to a given plated wire with the leading edge of the information pulse being initiated before the cessation of a coincidentally applied word pulse on the word-line with the information pulse being sustained after cessation of the word-line pulse, that is, a simultaneous application period as concerns the information and word pulses with the information pulse sustaining after the end of the word pulse.

A readout for the plated wire memory in the form of a binary "one" or "zero" is obtained when a pulse is applied to the word-line, that is, at the time defined by the initiation of the pulse on the word line. In response to the application of a word pulse, a polarized output current is developed from the plated wire the sense of which is dependent upon the direction of the magnetization of the plated wire at the intersection of the wire and the particular word-line upon which the pulse is applied.

The embodiment of the present invention to be described utilized a four-bit tuning code with provision for three preset channels and a fourth "manual" channel. In such a system the plated wire memory matrix comprises four word-lines, each of the word-lines being associated with one of the "manual" and first, second, and third preset channels of the system. The four-bit code necessitates four plated wires in parallel disposed relationship and transverse the axes of the word-lines so as to find a matrix of four "rows" and four "columns." Each of the four plated wires may have written therein, at the respective intersections of each word-line and plated wire, code bits in the form of sensed magnetizations. The application of a word pulse on any one given word-line simultaneously develops sensed output pulses from each of the four plated wires with respective sensings determined by the direction of the magnetizations of the plated wires at the particular intersection point with the energized one of the word-lines. Thus a four-bit code is stored in parallel fashion along the respective intersections of each word-line and the four wires. To write the four-bit code into the respective plated wires, an information pulse of one sense or another may be applied to a given plated wire with the leading edge of the information pulse being initiated before the cessation of a pulse on the word-line and being sustained after cessation of the word-line pulse.

As will be described, the present system utilizes the coded output from a binary counting means as information pulses to be stored into the plated wire memory. A word-line pulse train is employed which is time displaced with respect to state changes in the coded information bits from the counter. The word-line pulse train is properly timed to effect write-in of the code bits from the various counter outputs stages to respective associated ones of the plurality of plated wires in the memory.

In general operation, under manual mode of operation, one channel of the plated wire memory is utilized to continuously read in, on a real time basis, the instantaneously existing code generated by the binary counter and to read out the same code to the tuned device and indicator. Under this mode, the operator depresses the tune-up or tune-down control switch and merely observes on the indicator a desired tuned frequency to which the radio will instantaneously respond. Selection of any one of the three preselect channels instantaneously displays the stored tuning code word in that channel, and tunes the tuned device to that code word. The information stored in the preselect channels may be readily changed by activation of the tune-up or tune-down control in manual mode to observe a newly desired preselect frequency, selection of a preset channel into which the corresponding tuning code word is to be stored, followed by depression of a "write" button to effect storage of the tuning code word in the selected channel.

A system in accordance with the present invention is depicted functionally in FIG. 1. A clock source 10, which might be a flip-flop oscillator, generates a tuning pulse train of predetermined periodicy. The count-up –count-down control switch 11 selectively applies the time pulses through line 12' to a reversible binary counter 25 to cause the counter to incrementally increase or decrease in count in response to successive ones of the tuning pulses. The mode of count-up or count-down is determined by information on line 12. The output 13 from the binary counter 25 might then comprise, for example, four parallel outputs mutually defining the binary number corresponding to the existing count. The counter output 13, comprising a tuning code, is applied to a memory write circuitry 14 the output 16 of which is applied to a plated wire memory 17. A memory drive circuitry 15 is shown in functional relationship with the timing oscillator and write circuitry and with the memory 17 and memory readout circuitry 20. The parallel outputs 16 from memory write circuitry 14, in accordance with the present invention, are applied to four plated wires in the memory 17 with respective plated wire read-outs 19 being applied to a memory readout circuitry 20. The memory drive circuitry provides periodic pulses timed appropriately with respect to the clock source to function as plated wire readout pulses.

Memory readout circuitry 20, as will be further described, may comprise sensing amplifiers which, in response to sensed current impulses from the plated wires in the memory, generate output pulses or DC voltages of predetermined binary levels for application via a wire bundle 21 to a tuned device 22 to effect tuning thereof, and via a wire bundle 23 to simultaneously indicate on indicator 24 the frequency to which the device 22 is tuned.

Figure 2:
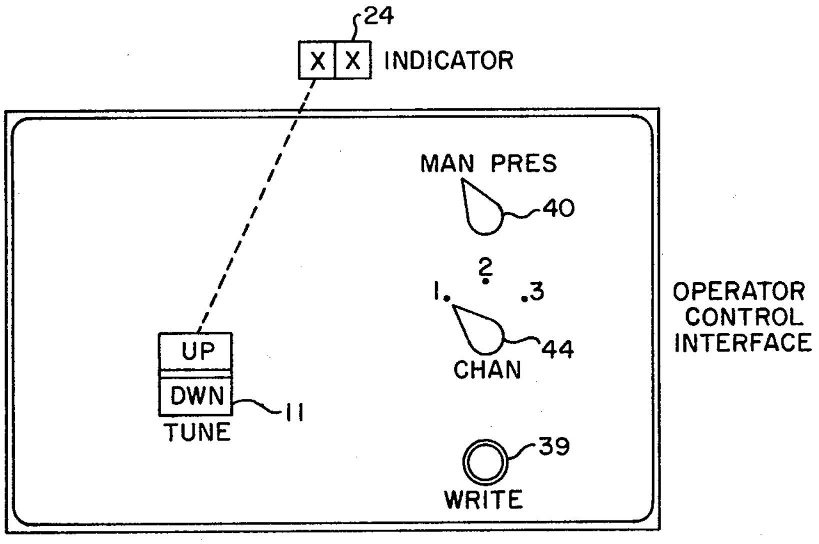
FIG. 2 is a diagrammatic representation of an operator interface control to be utilized with the present invention.
Figure 3:
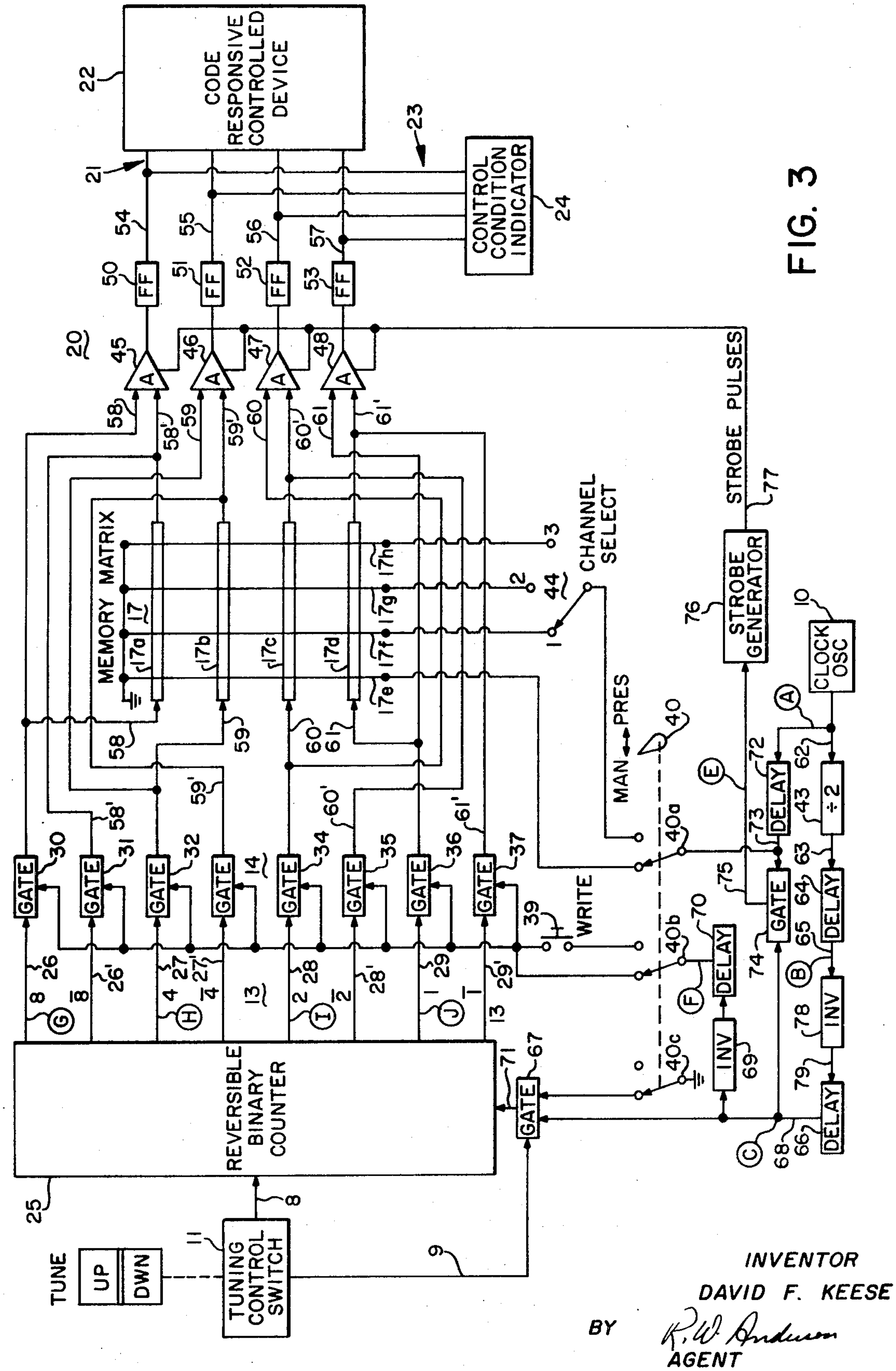
FIG. 3 is a functional block diagram of a four-bit, three preset channel, tuning system in accordance with the present invention.

The functional interrelationship of the general functional blocks of FIG. 1 as may be implemented in a four-bit, three preset channel system in accordance with the present invention is depicted in FIGS. 2 and 3.

A operator interface as might be employed with the present invention is depicted diagrammatically in FIG. 2. Four operator controls are embodied along with an indicator for observation of the tuned condition of a controlled device. A tuning control switch 11, which might be embodied as a rocker switch, causes the tuned device to be incrementally tuned "up" or "down" with the manual - preset switch 40 in the manual position. The instantaneously controlled or tuned condition of the controlled device is monitored on indicator 24. A channel select control 44 permits selection of a preset tuned condition for first, second, and third channels and, in conjunction with a "write" button 39, permits the operator to readily change the frequency or tuned condition that is preset for a specific channel.

As will be further evident, the preset frequency in a given channel may be changed by placing the manual - preset toggle switch 40 in the manual position and employing the rocker switch 11 to set the desired frequency on the indicator panel 24. The operator may then set the channel switch 44 to a selected one of the three available channels, set the manual preset switch 40 to preset position, and depress the write button 39 to write the newly selected frequency, as shown on indicator 24, into the particular channel. In this manner, each of the three memory channels may have written therein a selected frequency for instant "recall" by subsequent selection of any one of the three channels with the manual pre-set switch 40 in pre-set position.

FIG. 3 illustrates a four-bit system with provision for three pre-set channels and employing the operator interface of FIG. 2. The tuning rate of the system, when operated in the manual mode, is established by the periodicy of a clock oscillator 10 which applies a train of clock pulses 62 through a divider 43, a delay means 64, an inverter 78 and a delay means 66 to a gate 67. The delay means employed in FIG. 3 are of a commercially available type providing a predetermined time delay in those edges of applied pulses defining waveform transitions from a low state to a high state.

Gate 67 gates clock timed pulses 68 to the binary counter 25 through line 71 when the tuning control switch 11 is depressed for either an up or a down tuning command (line 8), and the preset - manual switch 40 is in the illustrated "-manual" position. Tuning control switch 11, when depressed in the "up" position, provides a "count-up" command through line 8 to the binary counter 25. Conversely, when the control switch 11 is depressed in the "down" position, a "-count-down" command is applied to the binary counter on line 8.

The reversible binary counter in the illustrated embodiment is a four-stage counter from which an output pair 26–26' corresponding to respective binary weights 8 and $\overline{\mathbf{8}}$ is taken along with output pair 27 and 27' corresponding to respective binary weights 4 and $\overline{\mathbf{4}}$, output pair 28–28' corresponding to respective binary weights 2 and $\overline{\mathbf{2}}$, and an output pair 29–29' corresponding to respective binary weights 1 and $\overline{\mathbf{1}}$.

The outputs 13 from the reversible binary counter 25 are selectively applied through a plurality of gates of 14 as information inputs to the plated wires **17*a*–17*d* of a plated wire memory matrix 17. Thus the outputs 26–26' from the counter are selectively applied through gates 30 and 31 and lines 58 and 58' to the respective ends of a first plated wire 17*a*** in the matrix.

In a similar fashion outputs 27–27' from the counter 25 are selectively applied through gates 32 and 33 and lines 59 and 59' to the respective ends of plated wire **17*b* in the matrix; outputs 28–28' in the counter are applied through gates 34 and 35 and lines 60 and 60' to respective ends of plated wire 17*c* in the matrix; and outputs 29–29' from the counter are selectively applied through gates 36 and 37 lines 61 and 61' to the respective ends of plated wire 17*d*** in the matrix.

In accordance with the aforedescribed "write-in" and "read-out" characteristics of a plated wire memory, the system of FIG. 3, utilizes word pulses properly timed with respect to the clock timed pulses effecting changes of binary count in the counter such that the counter output code bits in the form of a selectable binary code may be written into the memory and read out as desired by selective application of word pulses to the four "word-lines" **17*e*–17*h*** of the memory and strobe pulses to the sense amplifiers. In the system to be described four word-lines are employed, one for the manual function and three reserved for channel preset storage. Four plated wires are employed, one for each bit in the four-bit code employed. It is to be realized that any number of plated wires may be embodied, one being needed for each bit in the particular code of the system and the number of word-lines corresponds to the number of channels desired. For example, one might employ 17 plated wires for a 17 bit code and 11 word-lines to provide for a manual channel and 10 preset channels.

With reference to FIG. 3 it is seen that the clock timed pulses 68 are selectively applied (through gate 67 when the manual - preset switch 40 is in the "manual" position and the tuning control switch 11 is depressed) to the counter 25 to enable a change of count.

The gates 14, by means of which the binary counter outputs are selectively applied to the plated wires in the memory, are selectively enabled through a section **40*b* of the manual preset switch 40. In the "manual" position depicted, all gates are enabled while in the "pre-set" position the gates are enabled only upon depression of a "write" button 39**.

The clock pulse train 62 is additionally applied to a further delay means 72 and this delayed clock pulse train 73 is applied to a first word-line **17*e* of the matrix through section 40*a* of the manual - preset switch 40 when switch 40 is in "manual" position. The delayed pulse train 73 is selectively applied to the remaining three matrix word-lines 17*f*, 17*g*, and 17*h* through a selected position of the "channel select" switch 44**.

Readout of the memory 17 is accomplished at the time occurrence of falling edges of alternate (read) ones of pulses 73 applied to the word-lines **17*e*–17*h***, which time occurrences in accord with plated wire memory characteristics occur when no information pulse is being applied to the plated wires.

Read out is accomplished by memory readout circuitry 20, embodied as a plurality of sensing amplifiers associated individually with respective plated wires. Strobe pulses 77 allow the sense amplifiers to recognize memory information only during alternate (or read) ones of word pulses 73. Strobe pulses 77 are developed by gating alternate ones of delayed clock pulses from delay 72 with the clock timed pulses 68 in gate 74. A first sensing amplifier 45 is shunted across the respective end terminals of plated wire **17*a* of the memory. Sensing amplifier 46 is shunted across the respective end terminals of plated wire 17*b* of the memory. Sensing amplifier 48 is shunted across respective end terminals of plated wire 17*c* of the memory, and sensing amplifier 49 is shunted across respective end terminals of plated wire 17*d*** of the memory.

Sensing amplifiers 45–49 respond to the direction of current impulses generated in the associated one of the plated wires in the memory upon read out under the control of the applied word pulses 73, to store signal levels sensed in accordance with the direction of current impulses from the plated wire. The current impulse is in turn controlled by the binary information encoded in the wire at the point of read out. Flip-flops 50, 51, 52, and 53 receive the respective strobed outputs of sensing amplifiers 46–49 to provide binary output levels on output lines 54, 55, 56, and 57 respectively, which are applied in a first wire bundle 21 to a code responsive controlled device 22, and through a parallel wire bundle 23 to a control condition indicator 24. In the embodiment described, the four-bit binary code provides 15 discrete binary output code permutations to effect 15 discretely different controlled conditions of the controlled device 22.

Figure 4:
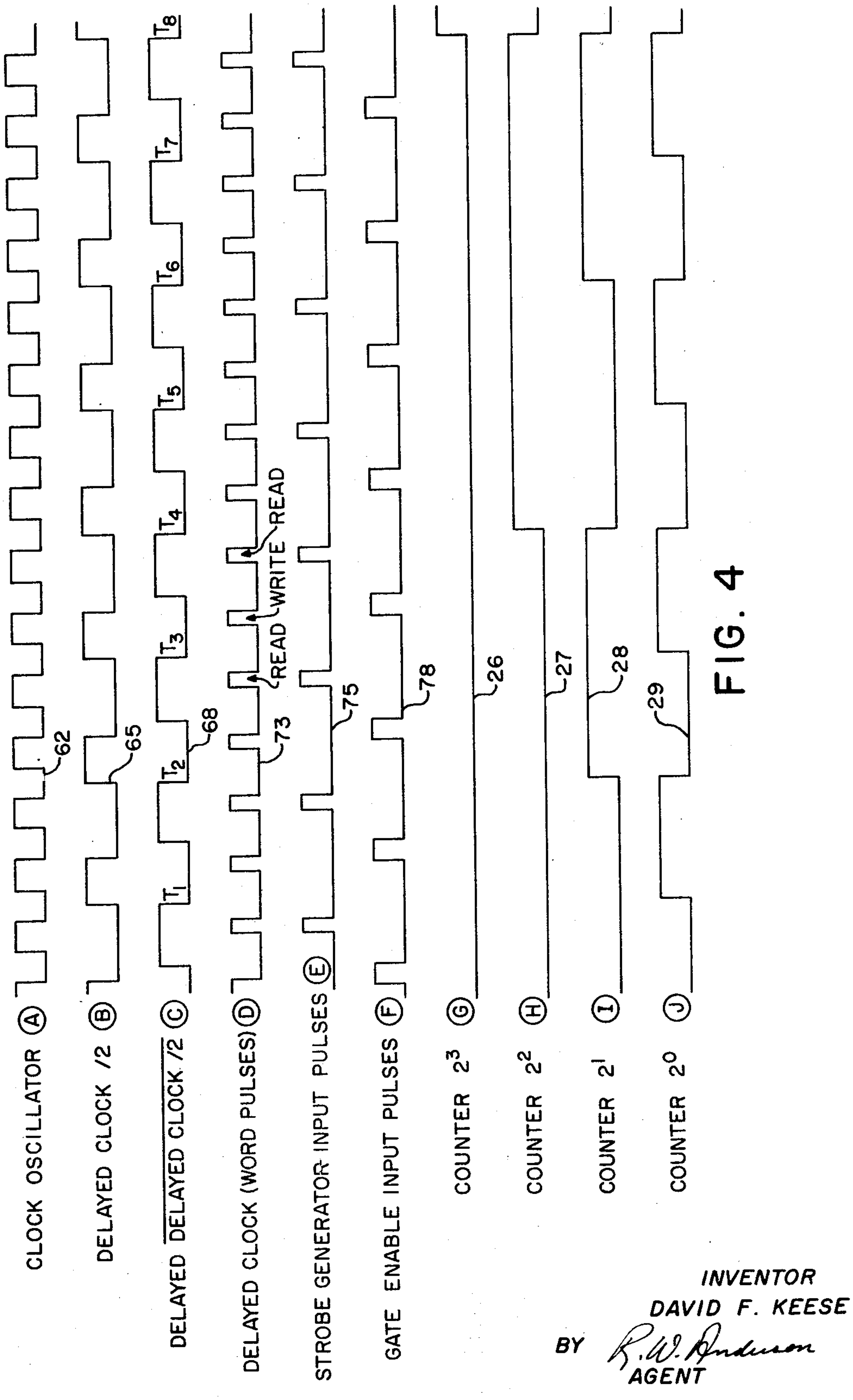
FIG. 4 is a diagrammatic representation of operational waveforms of the tuning system.

Before proceeding with discussion of the manual and preset channel operational characteristics of the system, reference is made to the waveforms of FIG. 4 which depict the relative timing relationship between the word pulses 73, as selectively applied to the word-lines **17*e*–17*h* of the memory, and that of the clock timed pulses 68, which control the binary count in counter 25. The output 62 from clock oscillator 10 (waveform A) is a train of periodic pulses. These pulses are divided, delayed, inverted, delayed again, and finally applied to the counter and are depicted as waveform C. Word pulses 73 are developed by application of clock pulses 62 to delay means 72 (waveform D). Strobe generator input pulses (waveform E) are developed by gating (gate 74) alternate ones of word pulses 73 via pulses 68 applied to the counter. Gate enable pulses 78 (waveform F) are developed by application of counter timed pulses 68 to inverter 69 and delay means 70**.

Waveforms G, H, I, and J of FIG. 4 depict the binary counter outputs on lines corresponding to $2^3$ (8), $2^2$ (4), $2^1$ (2) and $2^0$(1) binary weights. FIG. 4 depicts binary outputs resulting from eight clock timed pulses 68 (waveform C) being applied to the counter from an initial count of zero. It is noted that the change of level of any counter output line 26–29 between "1" and "0" occurs at the falling edge of one of the clock timed pulses 68 applied to the counter (one of times $t_1$ through $t_8$) but well before one of the word pulses 73 (waveform D) is applied to the word-lines in the matrix.

Binary counter outputs are then written into the plated wires by a word-line pulse (waveforms F and write pulses of D). The initiation of word-line write pulses D occurs following a change of counter output line level, and in each case the counter output line level is sustained beyond the cessation of that particular word-line write pulse.

Read out is accomplished at times corresponding to the leading edges of the word-line read pulses (waveform D) applied to the matrix word-line. The timing relationship permits the system to utilize one channel or "word" of the memory 17 in a manual timing function with the counter output being continuously read into and read out of the matrix for application to the sensing amplifiers for ultimate tuning control.

In the embodiment of FIG. 3, word-line **17*e* of the memory matrix is employed for "manual" operation. From an operational standpoint, manual operation is selected by the operator by placing the manual - preset switch 40 in "manual" position as illustrated in the figure. Modified clock pulses 68 are applied (through enablement of gate 67 by switch section 40***c*) to the counter 25 when the tuning control switch is depressed, thus permitting the operator to selectively change the binary count in an "up" or "down" direction.

Assuming then an initial count of zero in which the coded output from the counter binary is 0 0 0 0, the operator may tune the system in an "up"

direction by depression of the tuning control switch 11 to apply a sequence of clock timed pulses 68 through line 71 into the counter 25. The counter advances, as depicted in FIG. 4, in response to the "up" command logic presented to the counter via line 8. Each bit of successive binary outputs (corresponding to consecutive counts 1–8 at times $t_1$–$t_8$) is applied through an enabled one of gates 14 to an associated plated wire in the memory matrix. The bits defining successive binary counts are written into the memory matrix by the timing relationship between clock timed word pulses 73 (write pulses, waveform D), applied by enabling switch section 40*a* of the manual - preset switch 40, to word-line 17*e* of the matrix, and the gate enable pulses (waveform F). These bits are then read back out of the memory by the read pulses of waveform D. Thus in a continuous fashion the existing binary count in the counter is read into the memory matrix, read out by pulses applied on word-line 17*e*, sensed by sensing amplifiers 45–49, strobed and stored as binary output levels on output lines 54–57 for application to the tuned device and to the indicator. The indicator advances one digit for each delayed clock pulse applied to the counter in the "up" position while the code responsive controlled device responds to the successively different tuning command. It is seen that "manual" operating mode effects a system operation as though the counter outputs were applied directly to the controlled device and indicator.

Assuming then that the operator releases the tuning control switch when a count of eight is observed, the counter output remains at binary 1 0 0 0 which occurred at time $t_8$ in FIG. 4.

The remaining three word channels 17*f*, 17*g*, and 17*h* of the memory matrix are reserved for preset counts, that is, reserved to have recorded therein preselected binary code words for instant "recall" by the operator for tuning the controlled device to predetermined tuned conditions. The system permits a ready means for writing in these preset codes in the preset channel sections of the memory.

A preset tuning code may be initially stored in one of the memory channels (or a previously stored tuning code word in one of the memory channels changed) by first placing the manual - preset switch 40 in the "manual" position and depressing the tuning control switch 11 to change the count in counter 25 to a newly observed indication on indicator 24 in the operator interface. The operator may then set manual - preset switch 46 to "pre-set" position, select one of the three possible memory channels by channel switch 44, and store the existing count into that memory channel by depression of the write button 39 on the operator interface. Assuming the channel select switch were placed in channel 1 position, the indicated count would be entered into the word-line 17*f* of the memory matrix upon depression of the write button 39. Write-in of preselected counts into the remaining channels 2 and 3 would be accomplished by the same procedure with the channel select switch being positioned to the other two of the positions prior to depressing the write button 39.

It is noted that the write button 39 effects a controlled enablement ("write" button 39) of the gates 14 applying the counter output to the memory matrix when the manual - preset switch section 40*b* is in "pre-set" position, whereas, in the "manual" position of switch section 40*b*, the counter output gates are directly connected to gate enabling line 78.

The present invention is thus seen to provide a purely electronic system by means of which an operator may change the frequency of a radio by merely depressing a specific control switch. The system provides a predetermined number of "channels" into which preset tuning information may be selectively stored. The stored information is readily changeable upon operator command. The system additionally has the capability of tuning the radio or tuned device to any allowed frequency or condition at any time by employing one channel of the memory matrix for a continuous write-in and readout of binary tuning code information generated by the binary counter.

It is to be emphasized that the particular system described herein, as to the code bit capability and channel capacity, is by way of example only. Further, the particular types of switching logic employed are by way of examples, as it is contemplated that numerous implementations of logic circuitry might be employed to establish the necessary timing relationships and enabling and inhibiting functions. It is further contemplated that, while a plated wire memory has been described as being a preferred type of memory, other types of binary memory matrices might be employed to accomplish the end result. Thus, although the present invention has been described with respect to a particular embodiment thereof, it is not to be so limited, as changes might be made therein which fall within the scope of the invention as defined in the appended claims.

I claim:

1. A remote control system comprising a controlled device, said device including means for effecting tuning thereof in response to a binary tuning code input thereto, pulse generating means providing a train of timing pulses of predetermined repetition rate, tuning code generation means including a reversible binary counting means, means for selectively applying the output from said pulse generating means to said binary counting means to effect incremental forward and reverse counts therein upon application of successive ones of said train of timing pulses, means for developing a second control pulse train the timing of which is related to that of said pulse generating means timing pulses, a binary memory matrix comprising a plurality of binary storage means arranged in a plurality of rows and columns, each said storage means comprising an information input line, an information output line, and a control input line, the information input lines for each matrix row being serially interconnected and the control input lines for each column of the matrix being serially interconnected, means for selectively applying predetermined output bits from said tuning code generation means individually to respective associated ones of said matrix input information lines, means for applying said second control pulse train to a selected one of said matrix control lines, output sensing means associated with each of said matrix information output lines, said controlled device being connected to the output of said plurality of sensing means and being controllable in response to the collective signal permutation developed by said plurality of sensing means, and digital indicating means connected to the outputs of said plurality of said sensing means and, in response to said collective signal permutation, providing an indication of the controlled condition of said controlled device.

2. A remote control system as defined in claim 1 wherein each of said output sensing means comprises a sensing amplifier responsive to an associated one of said matrix information output lines to develop an output signal the polarity of which is defined by the sense of a last read out code bit from that information line, and a binary switching means responsive to said sensing amplifier output signal to exhibit and store an operational state indicative of the polarity of the last developed amplifier output polarity; the respective outputs of said binary switching means collectively defining a binary code word for application to said controlled device and said digital indicating means.

3. A remote control system as defined in claim 2 wherein said second control pulse train has a repetition rate double that of said timing pulses applied to said counter and the pulse time occurrences of said second control pulse train being within the times defining alternate half-cycles of said timing pulse train, first alternate pulses of said second control pulse train being effective in writing counter outputs bits into associated ones of said matrix information lines, second alternate pulses of said second pulse train intervening in time occurrence with said first alternate pulses being effective in reading matrix stored bits out on said information output lines, means for developing a train of strobe pulses in time correspondence with said first alternate pulses of said second control pulse train, and said strobe pulses being applied to each of said plurality of output sensing means to provide sampled sensing means output signals to the associated ones of said binary switching means.

4. A remote control system as defined in claim 3 wherein said gating means comprises a train of gating pulses the repetition rate of which equals that of said timing pulses as applied to said binary counter and the time occurrence and duration of which fall between successive times at which the count in said counter is changeable.

5. A remote control system as defined in claim 1 further comprising a plurality of gating means through which the code bit outputs from said binary counter are applied to the respective information lines of said matrix, a first switching means a first position of which effects a first operational mode wherein said timing pulses are enabled for selective application to said reversible binary counter means and said second control pulse train is applied to a first one of the control lines of said matrix, said gating means being enabled with said first switching means in said first position thereof; a second switching means to which said second pulse train is applied via said second position of said first switching means, said second switching means effectively application of said second pulse train to a selected one of the further control lines of said matrix; a second operational mode being effected by said first switching means in a second position thereof normally disabling said gating means between said binary counter means and said matrix and inhibiting the application of said timing pulses to said reversible binary counter and to said second switching means; and further switching means for selectively enabling said gating means with said first switching means in the second position thereof.

6. A remote control system as defined in claim 5 wherein each of said output sensing means comprises a sensing amplifier responsive to an associated one of said matrix information output lines to develop an output signal the polarity of which is defined by the sense of a last read out code bit from that information line, and a binary switching means responsive to said sensing amplifier output signal to exhibit and stored an operational state indicative of the polarity of the last developed amplifier output polarity; the respective outputs of said binary switching means collectively defining a binary code word for application to said controlled device and said digital indicating means.

7. A remote control system as defined in claim 6 wherein said second control pulse train has a repetition rate double that of said timing pulses applied to said counter and the pulse time occurrences of said second control pulse train being within the times defining alternate half-cycles of said timing pulse train, first alternate pulses of said second control pulse train being effective in writing counter output bits into associated ones of said matrix information lines, second alternate pulses of said second pulse train intervening in time occurrence with said first alternate pulses being effective in reading matrix stored bits out on said information output lines, means for developing a train of strobe pulses in time correspondence wit said first alternate pulses of said second control pulse train, and said strobe pulses being applied to each of said plurality of output sensing means to provide sampled sensing means output signals to the associated ones of said binary switching means.

8. A remote control system as defined in claim 7 wherein said gating means comprises a train of gating pulses the repetition rate of which equals that of said timing pulses as applied to said binary counter and the time occurrence and duration of which fall between successive times at which the count in said counter is changeable.

9. A remote control system as defined in claim 5 wherein said further switching means comprises a normally open manually activated momentary closing switch.

10. A remote control system as defined in claim 9 wherein said memory matrix means comprises a plurality of plated wires equaling the number of bits comprising the tuning code output from said binary counter, a plurality of word-lines corresponding to said number of matrix columns, and said means for developing said second control pulse train comprising means to develop a train of control pulses for application to said matrix word-lines the initiation of which occurs prior to those timing pulses effecting changes of count in said binary counter and the cessation of which occurs prior to any subsequent change of state of said binary counter output.

11. A remote control system as defined in claim 10 wherein the output from said binary counter means comprises an N-bit code, said plated wire memory comprises a quantity of N plated wires, said memory matrix means comprises a quantity of M word-lines including a first word-line associated with said first operational mode, and a further quantity of M−1 word-lines each associated with an individual one of the remaining ones of said matrix word-lines.

12. A remote control system as defined in claim 11 wherein each of said output sensing means comprises a sensing amplifier responsive to an associated one of said matrix information output lines to develop an output signal the polarity of which is defined by the sense of a last read out code bit from that information line, and a binary switching means responsive to said sensing amplifier output signal to exhibit and store an operational state indicative of the polarity of the last developed amplifier output polarity; the respective outputs of said binary switching means collectively defining a binary code word for application to said controlled device and said digital indicating means.

13. A remote control system as defined in claim 12 wherein said second control pulse train has a repetition rate double that of said timing pulses applied to said counter and the pulse time occurences of said second control pulse train being within the times defining alternate half-cycles of said timing pulse train, first alternate pulses of said second control pulse train being effective in writing counter outputs bits into associated ones of said matrix information lines, second alternate pulses of said second pulse train intervening in time occurrence with said first alternate pulses being effective in reading matrix stored bits out on said information output lines, means for developing a train of strobe pulses in time correspondence with said first alternate pulses of said second control pulse train, and said strobe pulses being applied to each of said plurality of output sensing means to provide sampled sensing means output signals to the associated ones of said binary switching means.

14. A remote control system as defined in claim 13 wherein said gating means comprises a train of gating pulses the repetition rate of which equals that of said timing pulses as applied to said binary counter and the time occurrence and duration of which fall between successive times at which the count in said counter is changeable.

* * * * *